United States Patent [19]

Kwon et al.

[11] Patent Number: 5,365,409
[45] Date of Patent: Nov. 15, 1994

[54] INTEGRATED CIRCUIT PACKAGE DESIGN HAVING AN INTERMEDIATE DIE-ATTACH SUBSTRATE BONDED TO A LEADFRAME

[75] Inventors: Young I. Kwon, San Jose; Louis H. Liang, Los Altos, both of Calif.

[73] Assignee: VLSI Technology, Inc., San Jose, Calif.

[21] Appl. No.: 71,921

[22] Filed: Jun. 4, 1993

Related U.S. Application Data

[63] Continuation of Ser. No. 839,191, Feb. 20, 1993, abandoned.

[51] Int. Cl.⁵ .............................. H05K 5/02
[52] U.S. Cl. ....................... 361/813; 174/52.1; 257/666; 257/676; 361/807
[58] Field of Search ............ 361/813, 807; 257/668, 257/676, 766, 688, 778, 678; 174/52.1, 52.4

[56] References Cited

U.S. PATENT DOCUMENTS

| | | | |
|---|---|---|---|
| 4,489,365 | 12/1984 | Daberkoe | 361/409 |
| 4,754,317 | 6/1988 | Comstock et al. | 357/70 |
| 4,774,635 | 9/1988 | Greenberg et al. | 361/421 |
| 5,213,748 | 5/1993 | Biswas et al. | 257/676 |
| 5,227,583 | 7/1993 | Jones | 174/52.4 |

FOREIGN PATENT DOCUMENTS

| | | | |
|---|---|---|---|
| 0210371 | 2/1987 | European Pat. Off. | 257/668 |
| 58-210650 | 12/1983 | Japan | 257/676 |
| 0183936 | 8/1986 | Japan | 357/70 |
| 0237459 | 10/1986 | Japan | 357/70 |
| 0165349 | 7/1987 | Japan | 357/70 |
| 0116152 | 4/1990 | Japan | 357/75 |
| 0232945 | 9/1990 | Japan | 357/70 |
| 2-253650 | 10/1990 | Japan | 257/676 |
| 3-167836 | 7/1991 | Japan | 257/676 |
| 0167872 | 7/1991 | Japan | 357/70 |
| 3-191560 | 8/1991 | Japan | 257/676 |
| 3-220761 | 9/1991 | Japan | 257/676 |
| 3-257854 | 11/1991 | Japan | 257/676 |

*Primary Examiner*—Leo P. Picard
*Assistant Examiner*—Donald A. Sparks
*Attorney, Agent, or Firm*—Patrick T. King

[57] ABSTRACT

A package design configuration for an integrated-circuit die includes a leadframe having its bonding fingers connected to the periphery of an electrically-insulated, heat-conductive substrate, formed, for example, of a ceramic material. A number of electrically conductive traces, or bonding islands, serve as intermediate bonding locations for shorter bonding wires connecting bonding pads on the integrated-circuit die to the bonding fingers of the leadframe. The conductive traces serving as bonding islands are formed by deposition of thin-film material using semiconductor fabrication techniques or by deposition of thick-film material using printing techniques. Various shapes and configurations of the conductive traces are available, such as elongated rectangular patterns, or zigzag patterns. Alternatively, the electrically-insulated, heat-conductive ceramic substrate is attached to the die-attach pad of a conventional leadframe.

8 Claims, 5 Drawing Sheets

INTEGRATED CIRCUIT PACKAGE DESIGN HAVING AN INTERMEDIATE DIE-ATTACH SUBSTRATE BONDED TO A LEADFRAME

This is a continuation of copending U.S. patent application Ser. No. 07/839,191 filed on Feb. 20, 1993, now abandoned.

BACKGROUND OF THE INVENTION

1. Field of the Invention

This invention relates to packaging techniques for integrated circuits and, more particularly, to techniques for mounting various sizes of integrated-circuit dies to a common leadframe and to techniques for improving the thermal performance of an integrated-circuit package.

2. Prior Art

In a conventional semiconductor integrated-circuit package, electrical connections to the bonding pads of an integrated-circuit die are provided through a thin metal leadframe, which is typically stamped or chemically etched from strips of copper-containing materials. The integrated-circuit die is mounted to a centrally-located die-attach paddle, or pad, of the leadframe. The die-attach paddle is rectangular in shape and is supported at each of its four corners by a radially extending support beam. The leadframe includes a number of thin, closely-spaced conductive leads which radially extend away from the edges of the die. The leads diverge away from the die and extend through the exterior walls of the molded package where they form the external I/O leads for the package. The innermost end of the leads are called bonding fingers. Very thin gold wires are bonded at one end to the bonding pads on the die and at their others ends to the bonding fingers of the leadframe. To fabricate leadframes having closely spaced bonding fingers, chemical etching techniques are used. As the number of I/O leads increases and as die sizes shrink, the spacing between the bonding fingers of the leadframe decreases so that it is difficult to fabricate leadframes even using chemical etching when the required spacing between the bonding fingers approaches the thickness of the leadframe material itself.

Another problem with the number of I/O leads increasing and the die sizes shrinking is that the bonding fingers at the ends of the converging leads must be located at specified distances away from the die to maintain a minimum spacing between leads, so that the distance from the bonding pads on the die to the bonding fingers increases. If the length of the bonding wires exceed 150 mils, a fabrication problem called "wire-wash" might occur in which the long, thin, typically gold bonding wires may be swept together or broken by the flow of a plastic epoxy molding material as the die and the leadframe are encapsulated within the plastic epoxy molding material to form the body of the package. Consequently, bonding wire lengths are sometimes limited to approximately 150 mils to minimize this problem.

One solution to this wire-wash leadframe-connection problem is to provide intermediate "bridges" between the die and the bonding fingers so that the distance therebetween can be spanned by two shorter segments of bonding wires.

One such bridge is disclosed in U.S. Pat. No. 4,754,317 entitled "Integrated Circuit Die-To-Lead Frame Interconnection Assembly and Method" by Comstock et al. FIG. 1 of the drawings for the instant patent application shows a sectional view of a prior art integrated-circuit package assembly 10 which is similar to the Comstock 317 reference. On the top surface of an integrated-circuit die 12 are provided bonding pads 13 to which are attached bonding wires by techniques known in the integrated-circuit packaging art. The die 12 is conventionally mounted to a die-attach pad 14 which is part of a leadframe assembly for leads having bonding fingers 16, typically shown. The die 12 lies within a central cavity 17 formed within an insulated bridging member, or substrate assembly 18. The substrate assembly includes conductors formed on a relatively thick insulator layer 22. The conductors 20 serve as intermediate connection points for a typical first bonding wire 24, which spans the gap between the bonding finger 16 and the conductors 20. The conductor 20 also serves an intermediate connection point for a typical second bonding wire 26, which spans the gap between one of the bonding pads 13 of the die 12 and one of the conductors 20. Encapsulating plastic epoxy material is molded around the die and the leadframe to form a body 30 for the integrated-circuit package assembly 10. The technique of using an intermediate substrate assembly 18, which has conductors formed thereupon and which is placed between the outer periphery of a die and the inner periphery of the bonding fingers of a leadframe, reduces bonding-wire sag and bonding-wire wash. For each I/O connection, one wire is bonded between one end of a conductive pathway on the substrate assembly and the die and another wire is bonded between the other end of the conductive pathway on the substrate assembly and a bonding finger on the leadframe.

U.S. Pat. No. 4,774,635 entitled "Semiconductor Package With High Density I/O Lead Connection" by Greenberg et. al. discloses a semiconductor packaging technique. FIG. 2 of the drawings for the instant patent application shows a prior art integrated-circuit package assembly 40, similar to the Greenberg 635 structure, for an integrated-circuit die 42. The die 42 has bonding pads 43 on its top surface, to which are attached bonding wires by techniques known in the integrated-circuit packaging art. The die 42 is conventionally mounted to a conventional die-attach pad 44 which is part of a leadframe assembly for the leads 4 6. The package assembly 40 includes an intermediate insulated layer 52, which has very thin, fragile conductive fingers 54 formed on its top surface. The conductive fingers 54 are bonded at one end to the bonding fingers 46 of the leadframe. The conductive fingers 54 shorten the gap which must be covered by bonding wires 60 extending from the bonding pads of the integrated-circuit die 42. The die 42 sits within a cavity 62 formed within the center region of the insulated layer 52. Note that this technique requires precise alignment and assembly of the thin, fragile conductive fingers 54 to their respective bonding fingers 46, which requires expensive fabrication equipment and processing steps.

The structures described in the Comstock 317 patent and the Greenberg 635 patent are limited to being used with integrated-circuit dies having only a certain size because a die must to fit within the cavities provided at the center of the leadframe. Consequently, a number of different sizes of leadframes must be prefabricated to accommodate various die sizes.

Consequently, it is apparent that a need exists for an integrated-circuit packaging technique for mounting a number of different die sizes to either a standard leadframe or to a non-standard leadframe, which is commonly used with a number of different die sizes. To substantially reduce manufacturing costs, it is preferred that a standardized, stamped lead frame be available for a number of die sizes.

Because of the rectangular geometry of a die and the converging pattern of the leads, the distance between a bonding pad and its corresponding bonding finger varies, depending upon whether the bonding pad is located near a corner of the die or near the midpoint of the side of the die. For example, the bonding distance for a bonding pad near a corner of a die may greatly exceed 150 mils, while the bonding distance for a bonding near the midpoint of a side may be approximately 150 mils. Consequently, a need exists for an integrated-circuit packaging technique which can optionally provide an intermediate bridge point for a long bonding wire span.

Sometimes it is necessary that an integrated-circuit die be electrically insulated from the die-attach pad to which the lower surface of the integrated-circuit die is attached. This may require the use of a dielectric material between the lower surface of the die and the conductive die-attach pad. Smaller dies typically require better thermal dissipation characteristics from their packaging configuration. Consequently, the need exists for an integrated-circuit technique which permits a die to be electrically insulated, but thermally connected to a die-attach pad portion of a leadframe.

SUMMARY OF THE INVENTION

It is therefore an object of the invention to provide apparatus and a method for providing wire-bonding connections to an integrated-circuit die from the leads of a leadframe In accordance with this and other objects of the invention, a package design configuration for an integrated-circuit die is provided. The package includes a leadframe having a plurality of bonding fingers extending from a central region. An electrically-insulated, heat-conductive substrate is provided which has a first surface to which the ends of the bonding fingers are bonded along its periphery. The substrate is formed from a thermally conductive material such as a ceramic material. The integrated-circuit die is attached to a central area of the substrate, corresponding to the central region of the leadframe. A number of electrically conductive bonding islands, or conductive traces, are formed on the first surface of the electrically-insulated, heat-conductive substrate. The conductive traces extend from the central area of the ceramic substrate to provide respective intermediate attachment areas for bonding wires which extend from bonding pads on the integrated-circuit die. The conductive traces also provide an intermediate attachment area for attachment of shorter bonding wires between the bonding fingers of the lead frame and the conductive traces.

The conductive traces serving as bonding islands are formed by deposition of thin-film material using semiconductor fabrication techniques or by deposition of thick-film material using printing techniques. Various shapes and configurations of the conductive traces are available, such as elongated rectangular patterns, or zigzag patterns. At the ends of each pattern of conductive traces, suitable bonding-pad areas are provided The invention provides the option of not having conductive traces for all of the bonding pads of the integrated-circuit die. The conductive traces are provided for bonding distances greater than, for example, 150 mils, typically encountered at the corners of the die.

Alternatively, the electrically-insulated, heat-conductive pad is attached to the die-attach pad of a conventional leadframe.

A method of packaging an integrated-circuit die is provided which includes bonding the ends of the bonding fingers of a leadframe to the periphery of an electrically-insulated, heat-conductive substrate. An integrated-circuit die is attached to a central area of the substrate. Bonding wires are attached from between bonding pads on the integrated-circuit die to respective ones of a plurality of electrically conductive traces, or bonding islands, formed on the electrically-insulated, heat-conductive substrate. Bonding wires are also attached between the bonding fingers of the leadframe and one of the plurality of electrically conductive traces.

The method includes the step of forming the electrically conductive traces by printing thick-films on the electrically-insulated, heat-conductive substrate or by depositing thin-films on the substrate.

The invention readily accommodates a variety of die sizes without changing the leadframe or the conductive traces formed on the ceramic substrate. Consequently, either standard leadframes or a common leadframe can be used according to the invention. The invention permits connections to an integrated-circuit die by providing connections to the die with the conductive traces.

Use of the electrically-insulated ceramic die-attach substrate permits the entire die to be electrically isolated from the leadframe, while providing good thermal performance with the thermally conductive die-attach ceramic substrate.

The method of the invention also provides for forming the conductive traces or bonding islands only where the distance between the bonding pads on the integrated-circuit die and a corresponding bonding finger of the leadframe is greater than 150 mils.

For cases where a particular bonding-wire length would be greater than 150 mils, such as at the corners of a die, the intermediate conductive traces are utilized. Connections to bonding pads on the die which require bonding-wire lengths less than 150 mils do not require use of the conductive traces. Consequently, the invention provides a flexible technique adapted to the needs of a particular die size and the wire-bonding length requirement of each bonding pad of an integrated-circuit die. Use of the standard die-attach paddle of a standard leadframe is also accommodated by the present invention.

BRIEF DESCRIPTION OF THE DRAWINGS

The accompanying drawings, which are incorporated in and form a part of this specification, illustrate embodiments of the invention and, together with the description, serve to explain the principles of the invention.

DETAILED DESCRIPTION OF THE PREFERRED EMBODIMENTS

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invent ion is intended to cover alternatives, modifications and equivalents, which may be included within the spirit and scope of the invention as defined by the appended claims.

Figure 1:
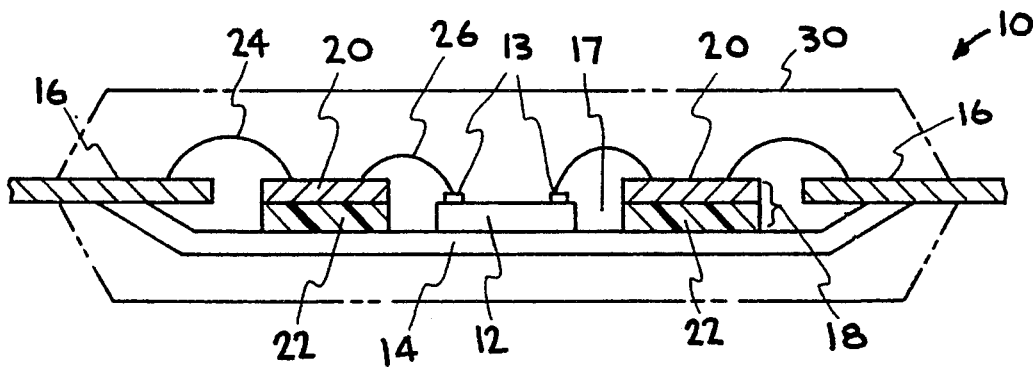
FIG. 1 is a sectional view of a prior art integrated-circuit package assembly which has a leadframe with an intermediate conductive substrate, or bridge member, fixed thereto to serve as an intermediate connection point for two shorter bonding wires.spanning the gap between a die and bonding fingers.
Figure 2:
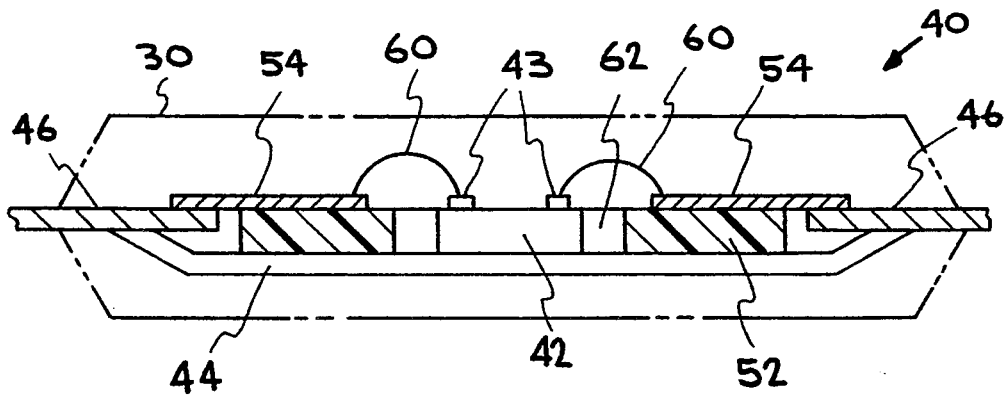
FIG. 2 is a sectional view of another prior art integrated-circuit package assembly which has an insulating-tape layer having conductive fingers formed thereupon, where the conductive fingers extend out and are bonded to the ends of the bonding fingers of a leadframe.
Figure 3:
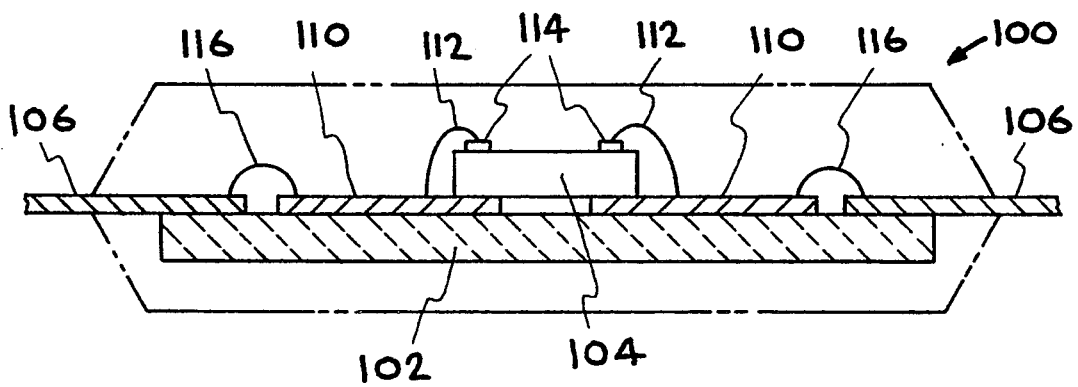
FIG. 3 is a sectional view of an integrated circuit package which uses an electrically-insulated, heat-conducting substrate on which the integrated-circuit die is mounted and on which are formed conductive traces which serve as intermediate junction points for connecting integrated-circuit dies of various sizes to bonding fingers of a leadframe with two shorter bonding wires.
Figure 4:
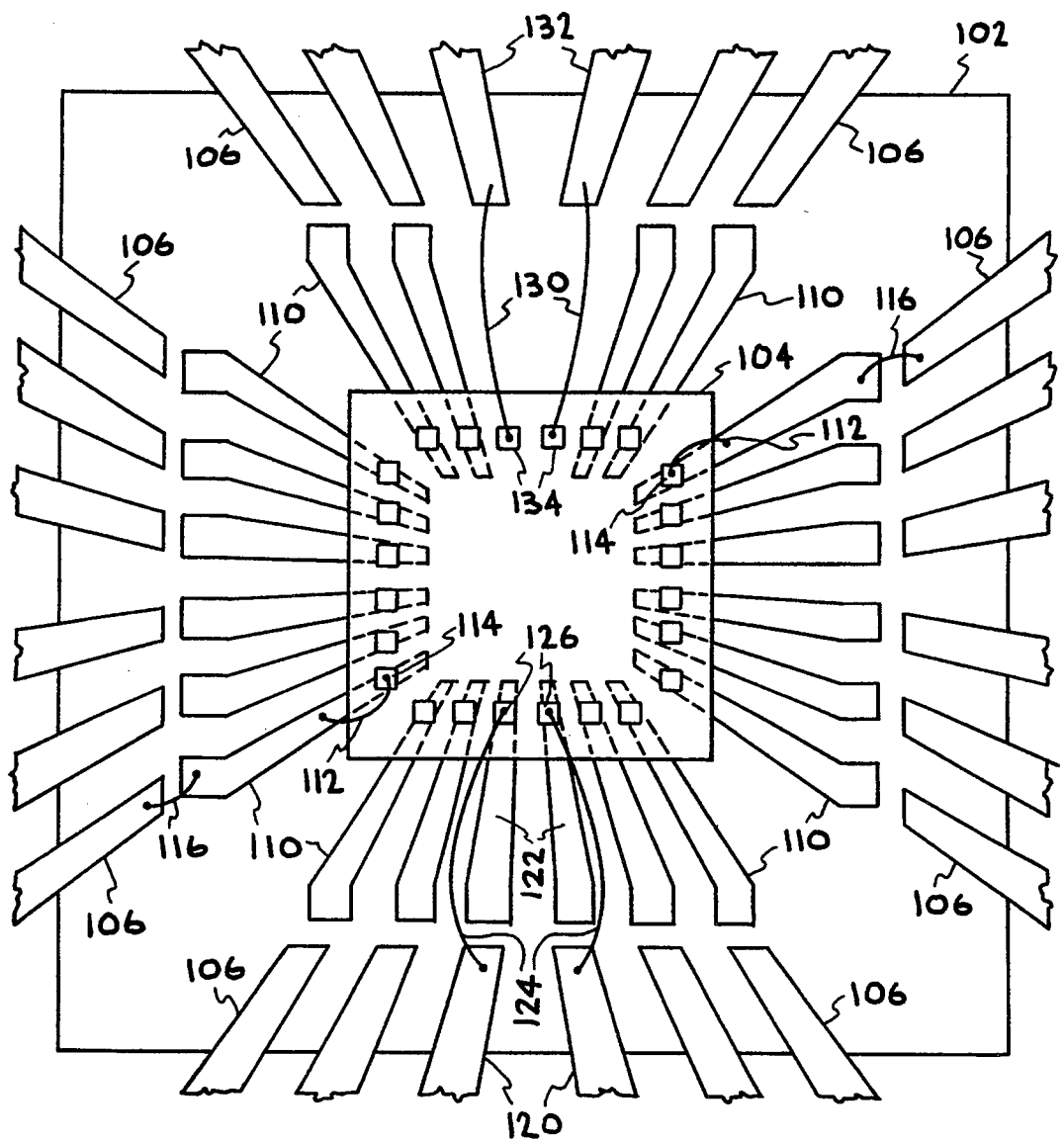
FIG. 4 is a plan view of the integrated circuit package arrangement of FIG. 3, showing the substrate and the integrated-circuit die overlying the conductive traces.

FIGS. 3 and 4 show an integrated-circuit package configuration 100, according to the invention. This embodiment of the invention uses an electrically-insulated, heat-conducting substrate 102 as a bonding pad for an integrated-circuit die 104. The electrically-insulated, heat-conducting substrate 102 is formed of a ceramic material such as alumina nitride, beryllium oxide, a very thin polymeric film, or an equivalent material having good heat conduction characteristics. The ceramic substrate 102 is bonded to the bonding-finger ends of the leads, typically shown as 106, of a leadframe. The ceramic substrate 102 serves as an electrically-insulated, thermally-conductive die-attach pad for the integrated-circuit die 104. In this embodiment of an integrated-circuit package configuration, the leadframe is not conventional because it does not have a conventional metal die-attach pad (such as shown in FIGS. 1 and 2 by the reference numerals 14,44), where the leadframe is formed along with the leads 106 from a thin sheet of metal material. The leads converge from the exterior walls of a molded package toward the central region of the ceramic substrate 104.

Electrically conductive traces, typically shown as 110, are formed on the substrate 102. These traces 110 serve as intermediate junction points for two shorter bonding wires, which are used for connecting dies of various sizes to bonding-finger ends of the leads. The conductive traces 110 extend outwardly from a central area of the ceramic substrate 104 such that the integrated circuit die 102 attached thereto overlies the conductive traces 110 and provide intermediate attachment locations for attachment of a first shorter bonding wire 112, which extends from a bonding pad (typically shown as 114) on the integrated-circuit die 104. The conductive traces 110 also provide an intermediate attachment area for attachment of a second shorter bonding wire 116, which extends to the bonding finger 106.

FIG. 4 also shows an optional use arrangement to accommodate cases where the entire distance, or bond-wire length, between a wire-bonding pad on an integrated-circuit die and the bonding finger is not greater than 150 mils. This case may occur for those leads 120 which are near the midpoints of the side of a die.

In the optional use situation where the bondwire length is not greater than 150 mils, the corresponding conductive traces 122 can alternatively not be used so that bonding wires 124 from the mid-point bonding pads 126 go directly from the bonding pads 126 on the die 104 to the bonding fingers 120.

In the optional arrangement where the wire-bond length is known to always be less than 150 mils, the corresponding conductive traces for those positions on the die are eliminated and bonding wires 130 are connected directly between the bonding fingers and the bonding pads 134, as indicated in FIG. 4.

The die 104 is attached to the ceramic substrate 102. The ceramic substrate 102 is a particularly good conductor of heat from the die 104 to the bonding-finger ends 106 of the leadframe. Use of the heat-conducting ceramic substrate 102 consequently improves the thermal performance of the integrated-circuit package.

Figure 5:
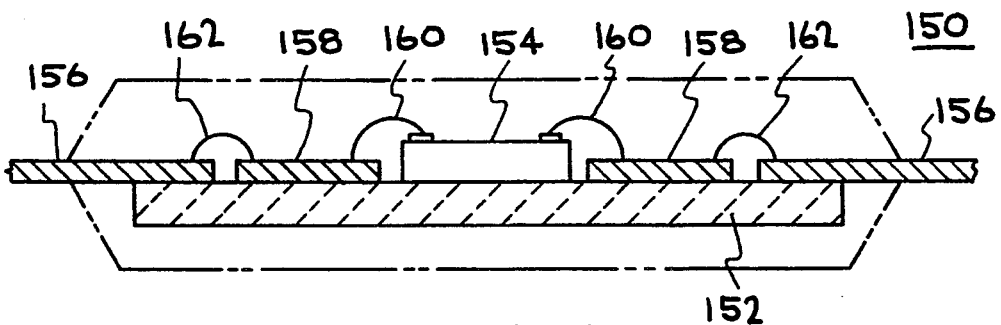
FIG. 5 is a sectional view of an electrically-insulated, heat-conducting substrate to which is attached a die, the bonding fingers of a leadframe, and intermediate conductive traces.

FIG. 5 shows an alternative packaging configuration, according to the invention. An electrically-insulated, heat-conducting ceramic substrate 152 has an integrated-circuit die 154 attached to its upper surface. The bonding fingers 156 of a leadframe are also attached to the upper surface of the ceramic substrate 152. Intermediate conductive traces, or interposers, 158 are deposited on the upper surface of the ceramic substrate 152 using, for example, thin-film deposition techniques or thick-film printing techniques. Connections are made between the die and the interposer 158 with bonding wires 160. Connections are made between the interposer 158 and the bonding fingers 156 with bonding wires 162. Note that the die 154 does not contact the interposers 158 and that dies of various size can be accommodated by this arrangement so that the length of any of the bonding wires can be maintained less than 150 mils.

To provide the thick film, or printed, patterns for the conductive traces, one technique is to use liquid-epoxy printing. A printing tool is provided which has a positive raised-relief of the pattern of the conductive traces formed on its surface. The printing tool is dipped in a gold-filled epoxy material and the gold-filled epoxy material is imprinted on the surface of the ceramic substrate.

Figure 6:
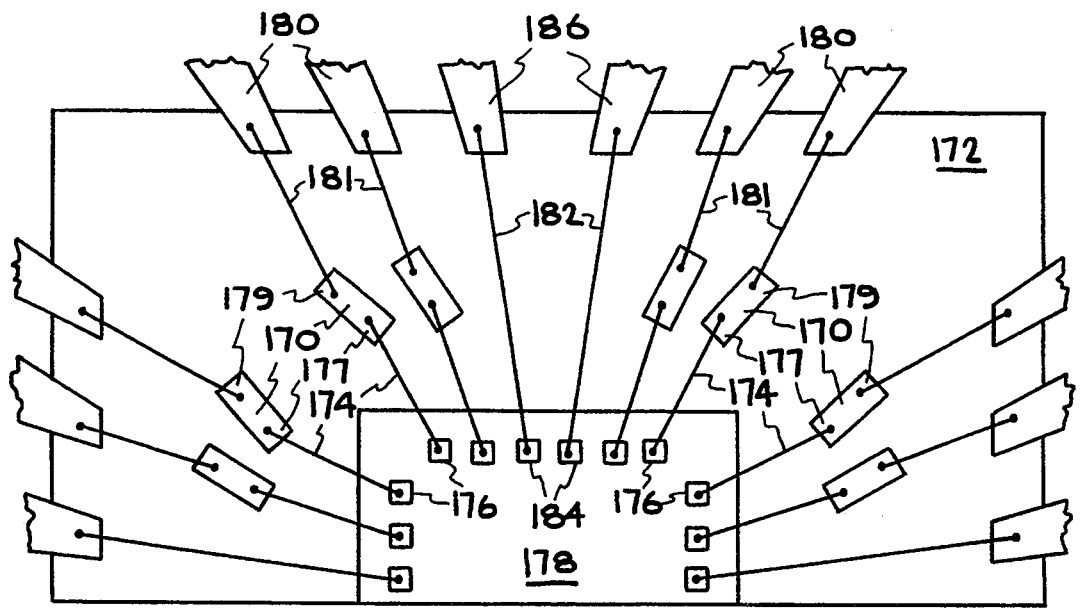
FIG. 6 is a plan, partial view of the arrangement of FIG. 5, showing one pattern for the conductive traces, or bonding islands.

FIG. 6 shows in plan view shows another alternative embodiment of a pattern of the generic bonding islands, or conductive traces, 158 of FIG. 5 . Elongated strips of conductive material 170 are formed on the upper surface of a ceramic substrate 172 . using either deposited thin films or printed thick-films.formed on the upper surface of the electrically-insulated, heat-conductive substrate 152. Short bonding wires, typically shown as 174, connect between bonding pads 176 on an integrated-circuit die 178 and the inner ends 176 of the bonding pads 170. The outer ends 178 of the bonding pads 170 are connected with short bonding wires 178 to inner ends of the bonding fingers 180. For package configurations where the distances between the bonding pads on the die and their corresponding bonding fingers are less than 150 mils, FIG. 6 shows that no intermediate bonding islands are used. For example, single bonding wires 182 connect the bonding pads 184 on the die 178 to respective bonding fingers 186. The intermediate conductive traces, bonding islands, are most often needed for bonding pads near the corners of a die where the distance to its corresponding bonding finger is greater than that for a bonding pad near the midpoint of the side of a die .

Figure 7:
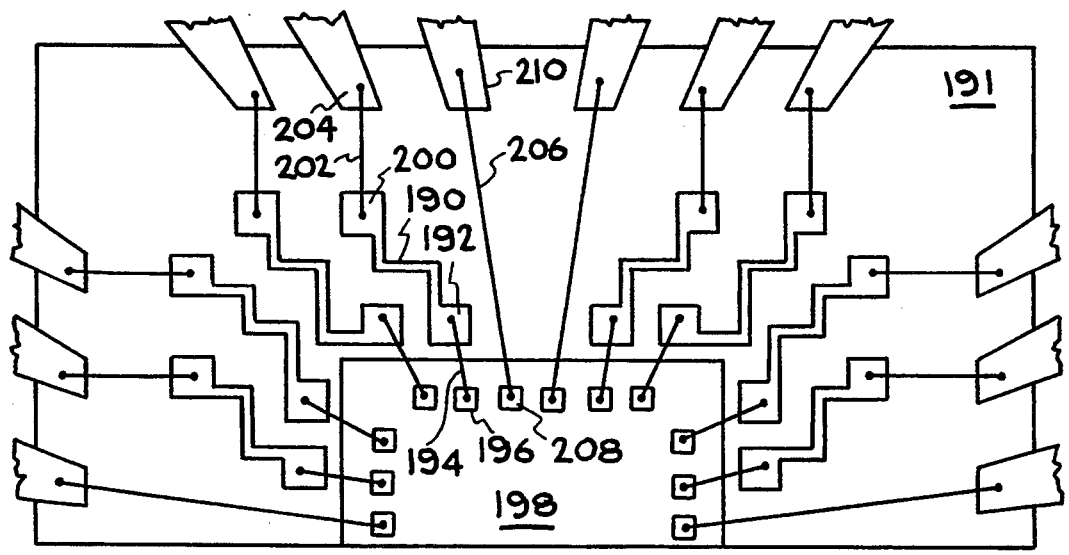
FIG. 7 is a plan, partial view of an alternative arrangement for the conductive traces, or bonding islands of FIG. 5.

FIG. 7 shows another alternative pattern of the generic bonding islands 158 of FIG. 5 where the pattern includes zigzag shaped conductive strips (typically shown as 190) formed on a ceramic substrate 191. A conductive strip 190 has a first bonding area 192 at its inner end. A first short bonding wire 194 is connected between the bonding area 192 and a bonding pad 196 on an integrated circuit die 198. A second bonding area 200 has one end of a second short bonding wire 202 attached thereto. The other end of the second short bonding wire 202 is attached to a bonding finger 204 which is fixed to the ceramic substrate 191. This figure also shows that, for bonding distances less than 150 mils, a bonding wire 206 is connected directly between a bonding pad 208 on the die 198 and a bonding finger 210 .

Figure 8:
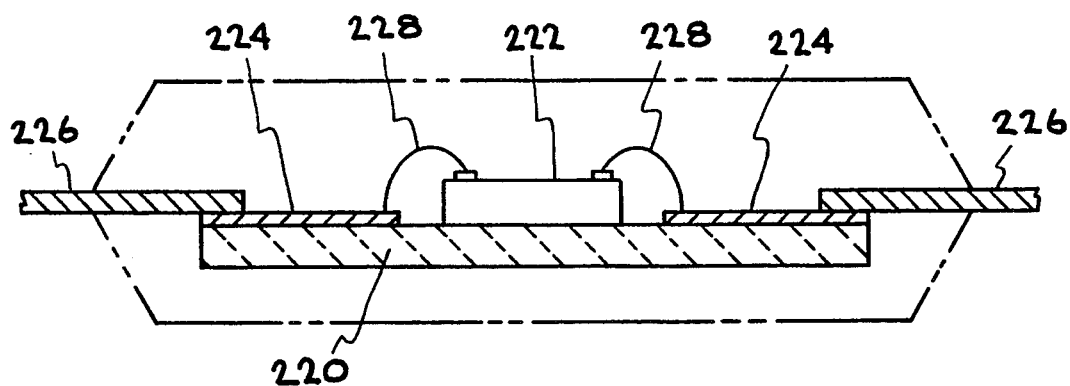
FIG. 8 is a sectional view showing an electrically-insulated, heat-conducting substrate having conductive traces formed thereupon which are directly connected to the bonding fingers of a leadframe.

FIG. 8 is shows an electrically-insulated, heat-conducting ceramic substrate 220 with an integrated-circuit die attached to its upper surface. Conductive traces 224 are formed on the ceramic substrate 220 . Bonding fingers 22 6 of a leadframe are directly connected to the conductive traces 224 . This arrangement eliminates the need for two bonding wires per bonding pad on the integrated-circuit die 222. Single short bonding wires 228 are shown connected between bonding pads on the die 222 and the conductive traces 224.

Figure 9:
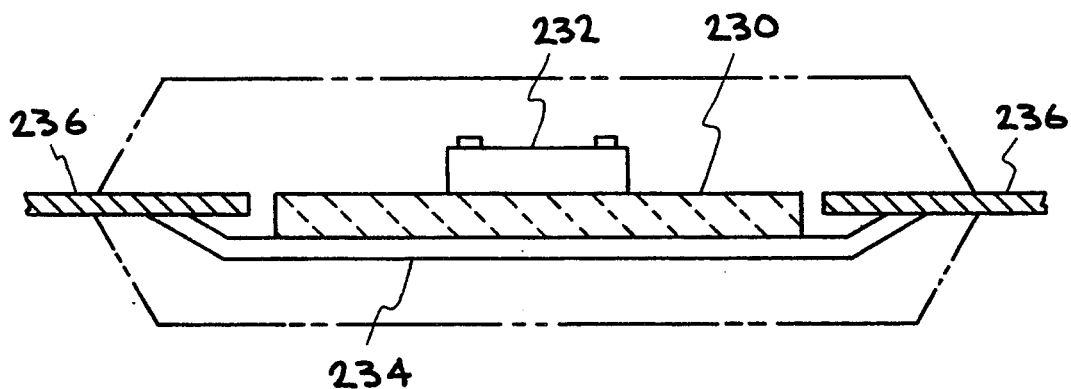
FIG. 9 is a sectional view showing an electrically-insulated, heat-conducting substrate which is mounted to a die-attach pad of a conventional leadframe.

FIG. 9 shows an electrically-insulated, heat-conducting ceramic substrate 230 with an integrated-circuit die 232 mounted on its upper surface. Bonding fingers 236 of a leadframe are adhesively directly bonded to tile electrically-insulated, heat-conducting ceramic substrate 230. Wire-bond wires 238 are connected between bonding pads on the die 232 and the bonding fingers 236.

Figure 10:
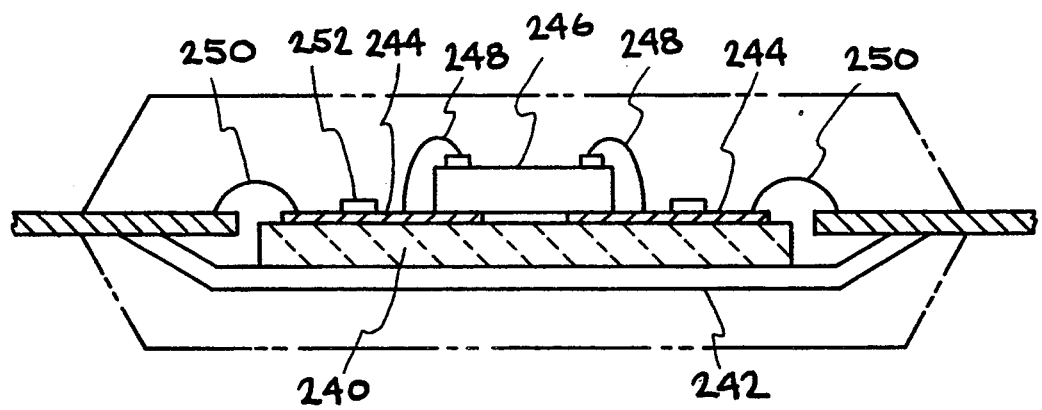
FIG. 10 is a sectional view showing an electrically-insulated, heat-conducting substrate mounted to a die-attach pad of a conventional leadframe, where the heat-conducting substrate includes conductive traces, or bonding islands, formed on its top surface and extending beneath the ceramic substrate to serve as an intermediate junction point for two shorter bonding wires for integrated-circuit dies of various sizes.

FIG. 10 shows an electrically-insulated, heat-conducting ceramic substrate 240 mounted to a die-attach pad 242 of a conventional leadframe. In this embodiment of the invention, conductive traces 244 are formed on the top surface of the ceramic substrate An integrated-circuit die 246 is mounted to the ceramic substrate 240 over the traces 244. These traces 244 are designed so that different sizes of dies can be accommodated by having the traces 244 extend beneath the die, as indicated in the figure. The traces 244 serve as an intermediate junction point for two shorter bonding wires 248,250.

Figure 11:
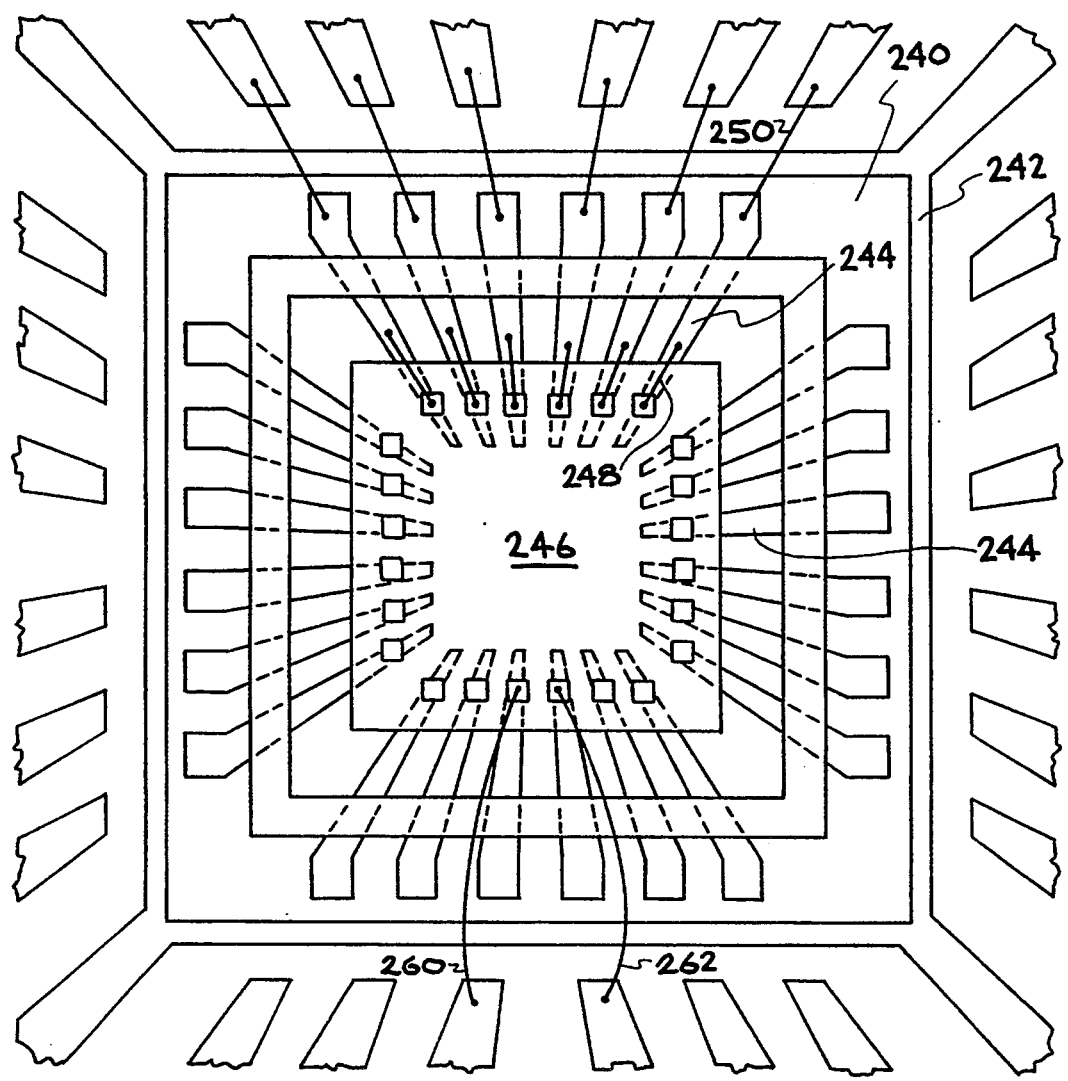
FIG. 11 is a plan view of the integrated circuit package arrangement of FIG. 10, showing the substrate mounted to the die-attach pad of the leadframe and showing the integrated circuit overlying the conductive traces on the substrate.

FIG. 11 is a plan view of the integrated circuit package arrangement of FIG. 10. The ceramic substrate 240 is mounted to the die-attach pad 242 of the leadframe. The integrated-circuit die is shown overlying the inner ends of the conductive traces 244 located on the upper surface of the the ceramic substrate 240. Bonding wires 260,262 are shown directly bonded between die-attach pads and their corresponding bonding fingers.

Direct connection of the bonding wires 260, 262 between the bonding pads and the bonding fingers tend to prevent shorting of the bonding wires to the conductors on the substrate because the integrated-circuit die 246 is elevated above conductors. This is in comparison to FIG. 1, for example, in which the die essentially sits low within a cavity so that a directly bonded wire would be more likely to contact the conductors on the bridge.

A method is provided according to the invention for packaging an integrated-circuit die. The ends of the bonding fingers of a leadframe are bonded to the periphery of an electrically-insulated, heat-conductive substrate. An integrated-circuit die is attached to a central area of the substrate. Bonding wires are attached between bonding pads on the integrated-circuit die and one of a plurality of electrically conductive traces, or bonding islands, formed on the electrically-insulated, heat-conductive substrate. Bonding wires are attached between the bonding fingers of the leadframe and one of the plurality of electrically conductive traces, or bonding islands.

The method includes the step of forming the electrically conductive bonding traces, or bonding islands, by forming thick-films or thin-films on the electrically-insulated, heat-conductive ceramic substrate. The bonding conductive trace, or bonding islands, are optionally formed where the distance between the bonding pads on the integrated-circuit die and a corresponding bonding finger of the leadframe is typically greater than 150 mils.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular us contemplated. It is intended that the scope of the invention be defined by the claims appended hereto and their equivalents.

We claim:

1. An integrated-circuit package configuration for packaging an integrated-circuit die, comprising:
a leadframe having a plurality of inwardly-extending bonding fingers and a central region, said inwardly-extending bonding fingers disposed peripherally surrounding said central region, an electrically-insulated, heat-conductive die-attach substrate having a first surface disposed in said central region of said leadframe, said integrated-circuit die mounted on said first surface of said die-attach substrate in said central region of said leadframe, said inwardly extending bonding fingers attached to the periphery of said die-attach substrate, such at said integrated circuit die disposed on said first surface in said central region of said die-attach substrate is peripherally surrounded by said inwardly extending bonding fingers, a plurality of electrically conductive, one-piece elongated bonding traces formed on said first surface of said electrically-insulated, heat-conductive die-attach substrate, said conductive, one-piece elongated traces having first and second ends, said first ends of said traces located in said central region, said traces extending from said central region of said die-attach substrate towards said inwardly-extending bonding fingers such that said second ends of said traces are proximate to a respective end of said inwardly-extending bonding fingers, said conductive one-piece elongated traces each providing a respective intermediate attachment area for attachment of respective bonding wires which extend between bonding pads on said integrated-circuit die and said conductive traces, means for electrically connecting each of said bonding traces to a corresponding bonding finger of said leadframe, wherein said means for electrically connecting each of said bonding traces to a corresponding bonding finger of said leadframe includes second bonding wires respectively connected between a bonding trace and a corresponding bonding finger.

wherein said conductive traces extend from said central region of said die-attach substrate such that said integrated-circuit die overlies said conductive traces while still providing an exposed portion of said conductive traces as a respective intermediate attachment area for said respective bonding wires.

2. The package configuration of claim 1 wherein said electrically-insulated, heat-conductive die-attach substrate is formed of a ceramic material.

3. The package configuration of claim 2 wherein said electrically-insulated, heat-conductive die-attach substrate is formed of a ceramic material selected from the group comprising alumina nitride and beryllium-oxide.

4. The package configuration of claim 1 wherein said electrically conductive, one-piece elongated bonding traces are formed on said electrically-insulated, heat-conductive die-attach substrate for those bonding pads on said integrated-circuit die which are greater than 150 mils from a corresponding bonding finger on said leadframe.

5. The package configuration of claim 1 wherein said bonding pads on said integrated-circuit die which are located closer than 150 mils from a corresponding bonding finger on said leadframe do not have a electrically conductive, one-piece elongated conductive trace provided therefor.

6. The package configuration of claim 1 wherein said electrically conductive, one-piece elongated traces are formed of a deposited thin-film material.

7. A method of packaging an integrated-circuit die, comprising the steps of:

bonding the ends of the inwardly-extending bonding fingers of a leadframe to the periphery of an electrically-insulated, heat-conductive die-attach substrate;

attaching said integrated-circuit die to a central region of said electrically-insulated, heat-conductive die-attach substrate;

forming a plurality of electrically conductive, one-piece elongated traces having first and second ends on said die attach substrate with said first ends of said traces disposed in said central region of said die-attach substrate, said traces extending from said central region of said die-attach substrate towards said ends of said inwardly-extending bonding fingers such at said second ends of said traces are disposed proximate to respective inwardly-extending bonding fingers, and such that said integrated-circuit die overlies said conductive traces while still providing an exposed portion of said conductive traces between said integrated-circuit die and said ends of said inwardly-extending bonding fingers as a respective intermediate attachment area for respective bonding wires;

attaching respective bonding wires from a first plurality of bonding wires between bonding pads on said integrated-circuit die and one of said plurality of electrically conductive traces by a second plurality of bonding wires, formed on said electrically-insulated, heat-conductive substrate;

connecting said bonding fingers of said leadframe and said corresponding electrically conductive traces.

8. The method of claim 7 including the step of forming the electrically conductive one-piece elongated traces by forming thin-films on said electrically-insulated, heat-conductive substrate.

* * * * *